United States Patent

Schuhmacher et al.

[11] Patent Number: 5,898,127
[45] Date of Patent: Apr. 27, 1999

[54] APPARATUS FOR SHIELDING AGAINST HIGH-FREQUENCY ELECTROMAGNETIC RADIATION

[75] Inventors: Manfred Schuhmacher, Alzenau; Götz Teschner, Hanau; Johannes Kunz, Hasselroth; Oldrich Medek, Maintal, all of Germany

[73] Assignee: Leybold System GmbH, Germany

[21] Appl. No.: 08/853,129

[22] Filed: May 8, 1997

[30] Foreign Application Priority Data

May 10, 1996 [DE] Germany ............... 196 18 766

[51] Int. Cl.⁶ ..................................... H05K 9/00
[52] U.S. Cl. ................... 174/35 R; 174/35 GC; 277/920
[58] Field of Search .............. 174/35 GC, 35 R; 361/816, 800, 818; 277/919, 920, 939

[56] References Cited

U.S. PATENT DOCUMENTS

| | | | |
|---|---|---|---|
| 4,831,498 | 5/1989 | Baba | 361/816 |
| 5,170,321 | 12/1992 | Oslund et al. | 361/722 |
| 5,731,541 | 3/1998 | Bernd et al. | 174/35 GC |

*Primary Examiner*—Kristine Kincaid
*Assistant Examiner*—Hung V. Ngo
*Attorney, Agent, or Firm*—Fulbright & Jaworski, LLP.

[57] ABSTRACT

A cover fitted about the periphery of an opening in a chamber wall is provided with a channel having therein both high frequency sealing elements which prevent escape of electromagnetic radiation, and a vacuum sealing element. The HF sealing elements are spaced apart by less than ¼ of the minimum wavelength λ to be shielded against, and are preferably held in the channel by a profiled element which also holds the vacuum sealing element. Alternatively, the channel may be provided in the chamber wall, or the sealing elements may be held in place without any channel.

12 Claims, 5 Drawing Sheets

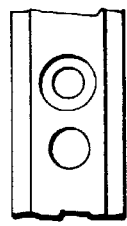
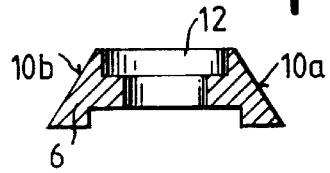
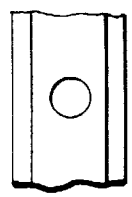
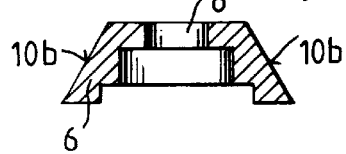
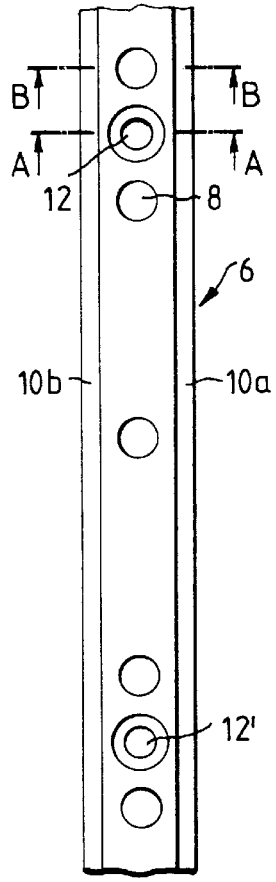
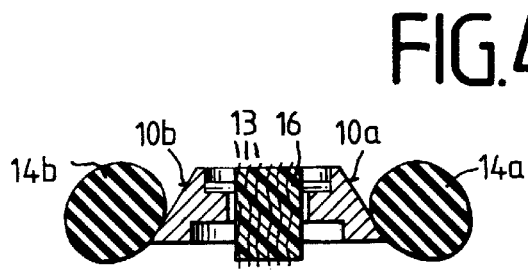
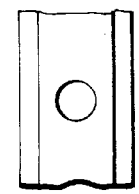
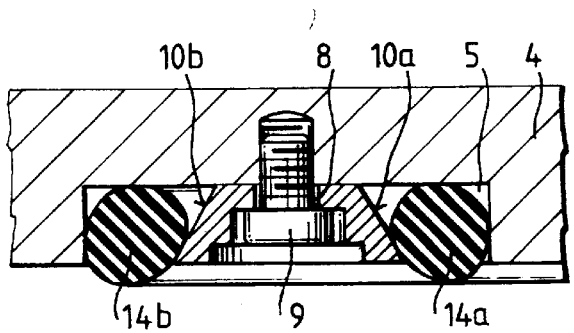
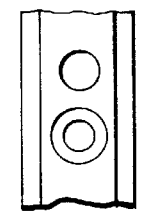

APPARATUS FOR SHIELDING AGAINST HIGH-FREQUENCY ELECTROMAGNETIC RADIATION

BACKGROUND OF THE INVENTION

The invention pertains to an apparatus for preventing high-frequency radiation in a cavity from escaping through the covered openings of the cavity.

Measures and apparatuses for providing effective shielding against, and for suppressing the escape of, electromagnetic, high-frequency alternating fields from the cavities surrounding them are known. For example, care must be taken especially in the design of pass-through openings in cavities such as door openings which must be opened and closed at regular intervals to ensure that the shielding elements covering the openings are in good electrical contact with the chamber walls forming the boundaries of the cavity and that no HF leaks are formed between the chamber walls and the shielding devices closing the openings as a result of remaining gaps, for example. Gaps of this type, especially when the size of the gap is equal to $\lambda/4$ of the wavelength $\lambda$ of the electromagnetic radiation present, act as slot antennas, through which the electromagnetic radiation to be shielded against can escape very effectively.

High-frequency electrical and/or magnetic alternating fields to be shielded against arise, for example, during the operation of magnetrons, which are used for cathode sputtering and the cathodic coating of surfaces. In these magnetrons, a high-frequency alternating electric field is used to maintain an electrical discharge between the cathode to be sputtered and the anode assigned to it. The typical operating frequencies of these types of cathode sputtering systems can be as high as 40 MHz. Because the cathode sputtering processes occur under vacuum conditions, the process chambers provided for them are frequently made vacuum-tight by means of rubber seals, but they are not always HF-tight in their original condition.

Especially the closable openings in the process chambers which must be provided for upkeep and maintenance, e.g., to replace the sputter cathodes, have turned out to be weak points with respect to HF leakage, especially after they have been opened and closed several times. As a result, the electromagnetic radiation which escapes from such process chambers acts as an interference signal, and because of the high radiation intensities required for the sputtering process, these signals can interfere severely with radio reception.

SUMMARY OF THE INVENTION

The object of the present invention is to shield against electromagnetic radiation so that electric and/or magnetic fields present in a cavity are prevented from escaping through radiation leaks especially in closable cavity openings.

In accordance with the invention, the cavity openings to be sealed off against the escape of electromagnetic alternating fields are covered by flat shielding bodies which are impenetrable to electromagnetic radiation. Between the flat body and the outer chamber wall of the cavity space, high-frequency (HF) seals are provided, which consist essentially of electrically conductive and elastically deformable material, by means of which the flat body and the chamber wall are brought into electrically conductive contact with each other. The HF sealing apparatus consists of individual HF sealing elements, which are arranged around the periphery of the chamber opening to be sealed off against HF radiation by the flat body, where the maximum distance between two adjacent HF sealing elements is less than $\lambda/4$, preferably less than $\lambda/40$, of the wavelength of the electromagnetic radiation to be shielded against. An advantageously tight HF sealing apparatus is achieved preferably by installing the HF sealing elements in a channel in the flat body and by supporting the HF sealing elements in guide holes, so that the position in which the HF sealing elements perform their sealing function can be adjusted over the range of the geometric production tolerances between the sealing cover and the housing to be sealed. The conductor strands projecting out of the HF sealing elements rest against the contact surfaces of the chamber cover and the chamber wall. Because of the elasticity of the HF sealing elements and their high coefficient and of friction, it is ensured that the housing wall is and the cover will remain in electrical contact by way of the HF sealing elements even after several openings and closings. As an alternative, it is also possible for the HF sealing elements to be mounted directly on the flat body, which has not been provided with channels.

Another advantage is obtained where it is necessary to seal process chambers in which pulsed plasmas are generated. Such plasmas are used in, for example, the PVD process for plasma coating, in plasma etching, and in pulsed sputtering for the plasma-activated vapor deposition of coatings on workpieces under vacuum conditions. To generate and maintain the vacuum pressures required during the plasma process, the access openings of the process chamber are sealed by conventional vacuum sealing elements, which consist of, for example, elastically deformable material (O-rings).

The vacuum sealing elements are mounted in a groove formed in, for example, the cover. According to the invention, it is possible and especially advantageous to provide both the vacuum sealing elements and also the HF sealing elements jointly in a shared channel formed either in the flat body provided to cover the opening or in the housing chamber wall. For this purpose, the vacuum seals are mounted removably by means of a strip inserted in the groove, and guide holes are also provided in the strip to hold the HF sealing elements. The combined installation of both the vacuum sealing elements and the HF seals preferably in a single channel is advantageous because it simplifies the construction work and lowers the cost of producing a process chamber which is both vacuum-tight and impermeable to high-frequency reduction.

The vacuum seal can also consist of two parallel sealing elements extending all the way around the opening, the HF sealing elements being installed between the two vacuum sealing elements. The HF sealing elements are thus protected advantageously against mechanical and corrosion-related damage.

The HF sealing elements and/or the vacuum elements are held in the channel by a replaceable sealing strip. This makes it possible to retrofit both existing HF chambers and those which can also be evacuated with the HF seal according to the invention, possibly in combination with vacuum sealing elements.

The individual HF sealing elements consist of individual, thin, flexible conductors embedded in elastically deformable material. Both ends of the individual conductors project out of the elastic base body, one resting against the chamber wall, the other against the chamber cover. The ends of the conductors are able to penetrate through any electrically insulating oxide layers which may have formed on the chamber wall and/or on the chamber cover, and thus electrically conductive contact is established between the chamber wall and the chamber cover. This makes it possible for the HF seal according to the invention also to be used effectively in the case of chamber walls or flat bodies covered by thin oxide layers.

BRIEF DESCRIPTION OF THE DRAWING

FIG. 2 shows an enlarged, broken section of the sealing strip shown in FIG. 1;

FIG. 3a shows a cross sectional view along line A–A' of FIG. 2;

FIG. 3b shows a cross-sectional view along line B–B' of FIG. 2;

FIG. 4a shows an enlarged view of the cross section of a sealing strip shown in FIG. 3a together with its assigned vacuum sealing elements and HF sealing elements;

FIG. 4b shows an enlarged view of the sealing strip shown in FIG. 3b with its assigned vacuum sealing elements and a mounting screw;

DETAILED DESCRIPTION OF THE PREFERRED EMBODIMENTS

Figure 1:
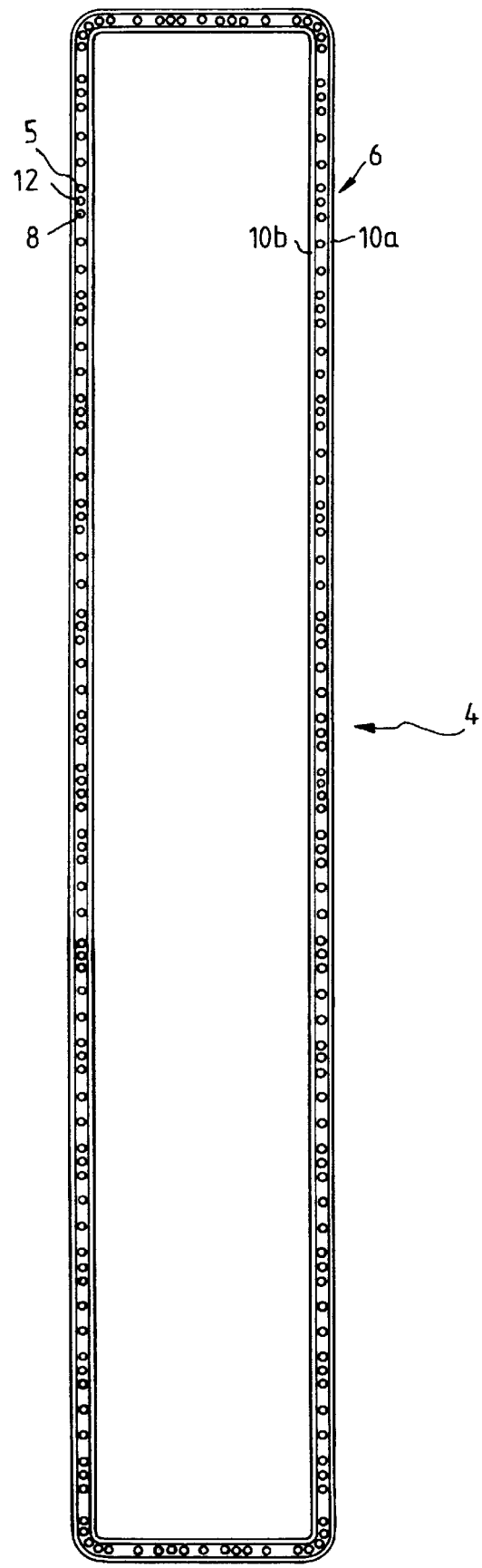
FIG. 1 shows a top view of the sealing side of a rectangular process chamber cover provided with a vacuum seal and an HF seal.

The outer edge of an essentially rectangular housing cover 4, shown in FIG. 1, is provided with a peripheral channel 5 to hold a sealing strip 6, vacuum sealing elements 14a, 14b, and HF sealing element 16 (see FIGS. 4a, 4b). Vacuum sealing elements 14a, 14b consist of elastically deformable rubber rings, which are preferably circular in cross section. The peripheral surfaces of these rings rest in a vacuum-tight manner against chamber wall 2 on one side and against housing cover 4 on the other (see FIGS. 5–8). Vacuum seals 14a, 14b are held in channel 5 by means of sealing strip 6, 22, 30, 36, 42, which holds them securely but which also allows them to be removed easily. Each of the sealing strips 6, 22, 30, 36, 42 forms a continuous unit along the exposed side, and each has ramps 32a, 32b; 38a, 38b; 44a, 44b; 50a, 50b (see FIGS. 5–8), which extend in parallel directions and which are also parallel to channel 5. Vacuum seals 14a, 14b rest under light pressure against these ramps and are thus held by them in channel 5 in a position which is fixed in all 3 dimensions with respect to chamber cover 4 and chamber wall 2 and are thus unable to slide out of place sideways or fall out.

HF sealing elements 16, 24, 34, 40, 46, 46', are inserted into guide holes 12, 12' (see FIGS. 5–8) provided in sealing strip 6, 22, 30, 36, 42 and held therein by a friction fit in the direction in which they can slide with respect to housing wall 2. By means of retaining pins 18, 18' (see FIGS. 8–11), sealing elements 16, 16' are prevented from falling out unintentionally. HF sealing elements 16, 24, 34, 40, 46, are conventional HF seals, which are made of an elastomer into which conductive metal threads have been cast. The metal threads project freely out from the elastomeric material, e.g., silicone, at the ends facing housing wall 2 and housing cover 4; when housing wall 2 is sealed by housing cover 4, the metal threads of contact surfaces 17, 17'; 20, 20' are thus pressed against housing cover 4 and housing wall 2, respectively. Any insulating oxide layers which may have formed on the contact surfaces are broken and penetrated locally by the metal threads, and the electrically conductive connection between housing wall 2 and housing cover 4 is produced.

Figure 8:
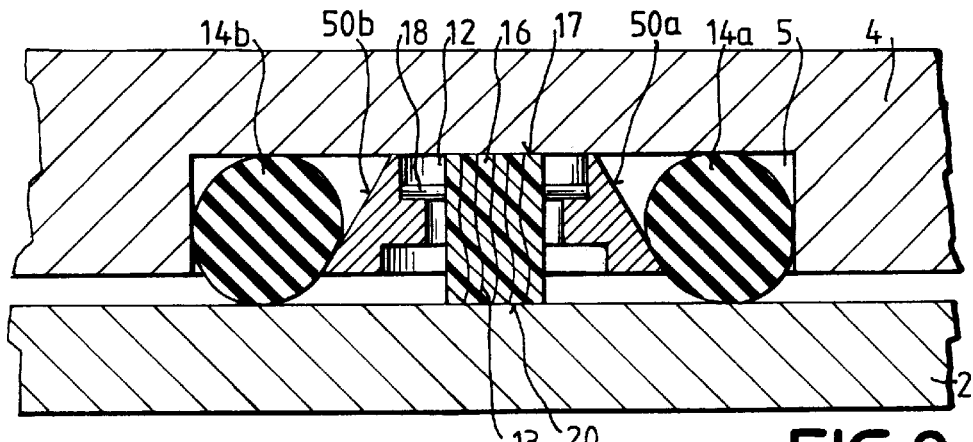
FIG. 8 shows a vacuum and HF sealing apparatus installed in a channel in accordance with a fifth exemplary embodiment.
Figure 9:
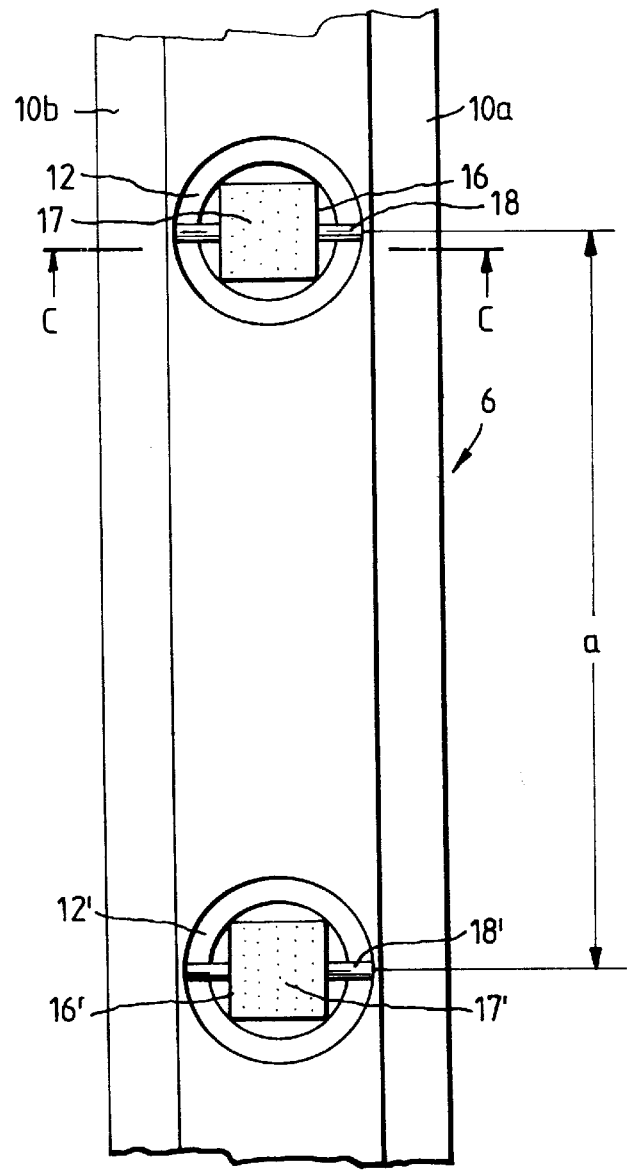
FIG. 9 shows a rear view of a sealing strip with two of the HF sealing elements shown in FIG. 8.
Figure 10:
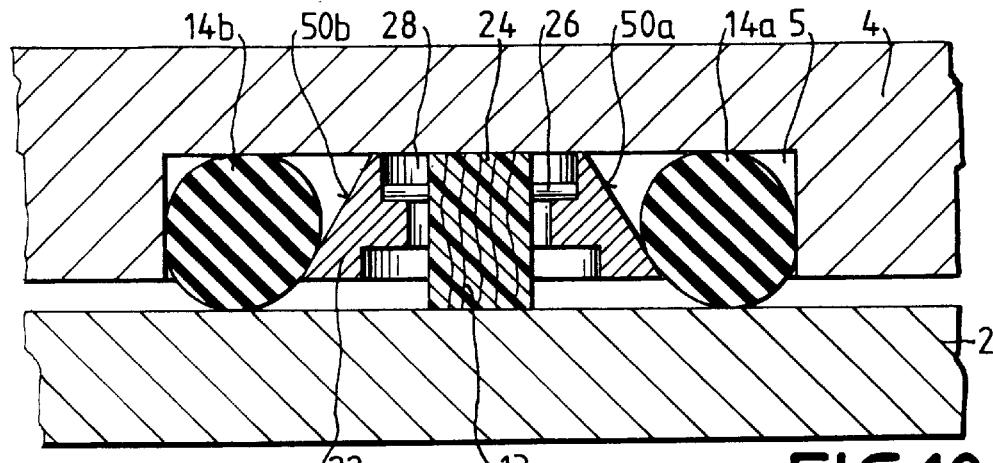
FIG. 10 shows a rear cross-sectional view of a sealing strip in which HF sealing elements are inserted in accordance with another exemplary embodiment.

According to the exemplary embodiment shown in FIG. 9, HF sealing elements 16, 16' are provided with essentially square contact surfaces 17, 17' and are spaced a uniform distance a apart along the entire length of sealing strip 6 (see FIGS. 8 and 9). Distance a between adjacent HF sealing elements 16, 16' to be selected is determined in accordance with the minimum wavelength $\lambda$ of the existing electromagnetic radiation to be shielded against. Good shielding properties with high attenuation levels are obtained when the distance a is $<\lambda/4$ of the radiation wavelength $\lambda$ to be shielded against. Series of experiments have demonstrated that, for values of a $<\lambda/40$, a highly effective HF sealing arrangement permitting almost no electromagnetic radiation to escape can be produced.

Figure 11:
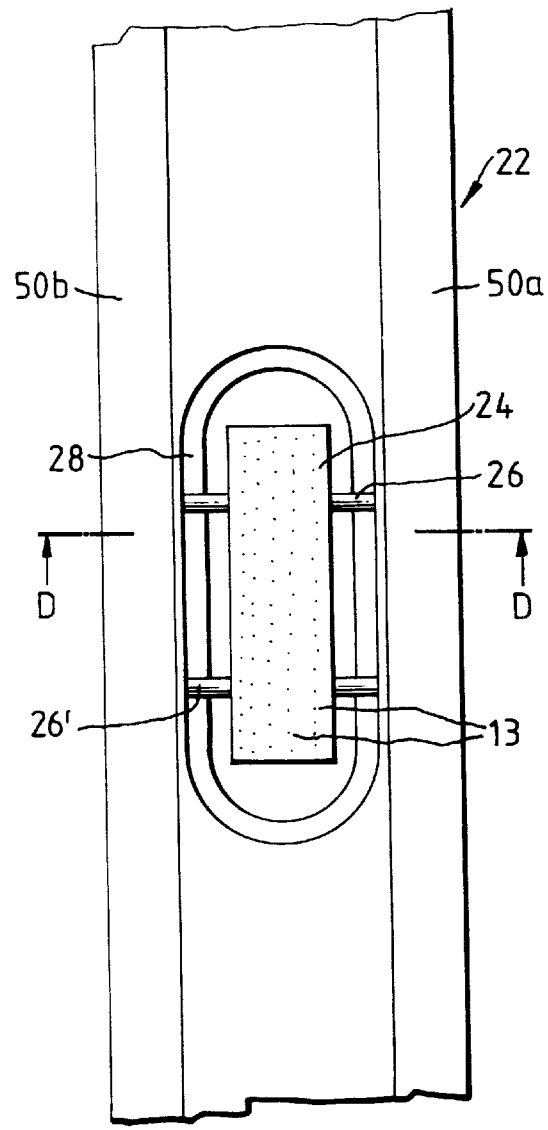
FIG. 11 shows a rear view of a sealing strip in which an HF sealing element is inserted in accordance with another exemplary embodiment.

In the HF sealing arrangement shown in FIG. 11, HF sealing element 24, 24' has a rectangular block-like form extending along channel 5 and is held in place in guide hole 28 by two retaining pins 26, 26'.

Instead of being held by retaining pins 18, 18 (see FIG. 9) or 26, 26'(see FIG. 11), HF sealing element 34 (see FIG. 5) can be held by a friction fit in sealing strip 30, where a profile 15 is formed on the strip, which engages in a counterprofile formed on the outside surface of HF sealing element 34.

Figure 5:
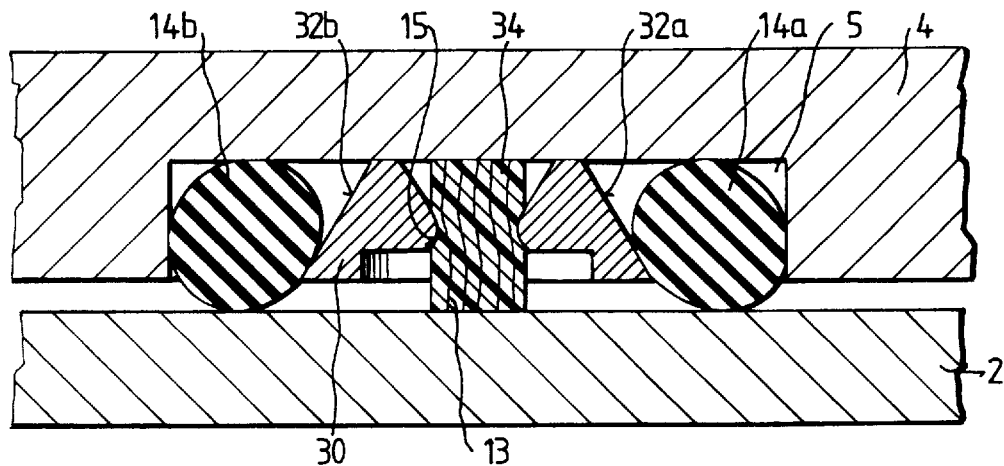
FIG. 5 shows a cross-sectional view through a vacuum and HF sealing apparatus installed in a channel in accordance with a second exemplary embodiment.
Figure 6:
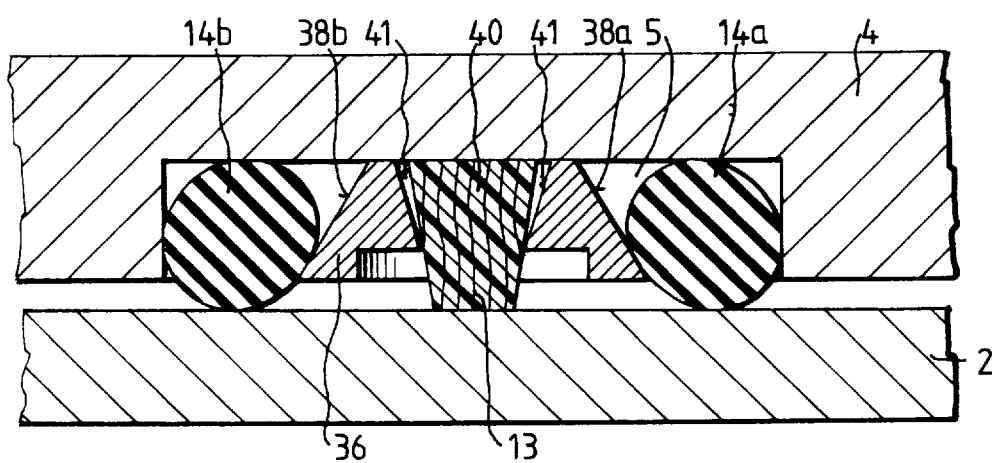
FIG. 6 shows a vacuum and HF sealing apparatus installed in a channel in accordance with a third exemplary embodiment.

As an alternative to the design of profile 15 formed on sealing strip 30 shown in FIG. 5, it is also possible to provide strands 138a, 138b of the strip with a conical profile 41, as shown in FIG. 6; the HF sealing element 40 thus projects like a funnel into this profile and is prevented from falling out of sealing strip 36.

Figure 7:
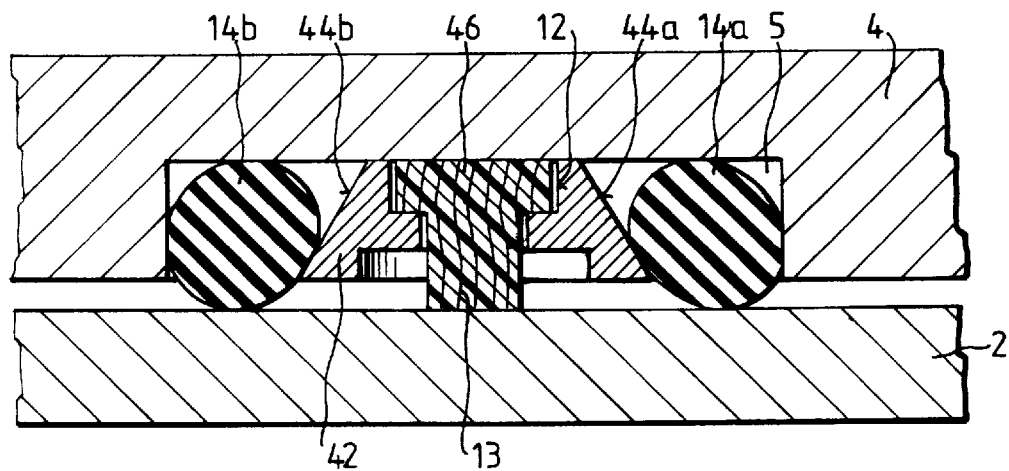
FIG. 7 shows a vacuum and HF sealing apparatus installed in a channel in accordance with a fourth exemplary embodiment.

As an alternative to retention by a friction fit as in the case of HF sealing elements 34, 40, it is possible, as shown in FIG. 7, for HF sealing element 46 to be inserted in a positive, form-locking manner into an appropriately designed, profiled recess in sealing strip 42. As a result, HF sealing element 46 is effectively prevented from falling out of sealing strip 42, and it is possible to omit entirely any additional retaining pins.

Sealing strip 6 can be held in groove 5 (see FIGS. 4b and 8) by means of screws 9 (see FIG. 4b), passing through a series of through-holes 8, arranged a certain distance away from each other. As a result, it is possible to replace or renew a vacuum seal with an integrated HF sealing arrangement quickly even in cases of preexisting housing covers or chamber walls with a channel.

We claim:

1. Apparatus for preventing electromagnetic radiation having a minimum wavelength $\lambda$ from escaping a cavity, said apparatus comprising a chamber comprising a wall defining said cavity, said wall having therein an opening with an outer periphery, a cover which is impenetrable to electromagnetic radiation, said cover being closable against said wall about said outer periphery, and a plurality of HF sealing elements fitted between said cover and said chamber wall about said outer periphery, each element having therein electrical conductors which establish electrical contact between said cover and said chamber wall, said elements being spaced apart by a distance less than $\lambda/4$ wherein said chamber wall and said cover are provided with a continuous peripheral channel about said opening, said apparatus further comprising at least one vacuum sealing element in said channel whereby said opening is sealable in a vacuum tight manner.

2. Apparatus as in claim 1 further comprising a profiled sealing strip which jointly holds both said HF sealing elements and said at least one vacuum sealing element in said channel.

3. The apparatus according to claim 1, wherein said sealing elements are formed of resilient material.

4. The apparatus according to claim 3, wherein said electrical conductors comprise metal threads in said resilient material, each of said threads having two ends, one of said ends conductively engaging said cover and the other of said ends conductively engaging said chamber wall.

5. The apparatus according to claim 1, wherein said sealing elements have a portion engaging the cover and a portion engaging the chamber wall.

6. The apparatus according to claim 5, wherein the portion of the sealing elements engaging the cover has a larger cross sectional area in a plane parallel to the cover where said sealing elements engage the cover than the portion of the sealing elements engaging the chamber wall.

7. The apparatus according to claim 1, wherein the sealing elements have a generally circular cross section taken in a plane parallel to the cover where said sealing elements engage the cover.

8. The apparatus according to claim 1, wherein the sealing element has a generally rectangular cross section taken in a plane parallel to the cover where said sealing elements engages the cover.

9. The apparatus according to claim 1, wherein a sealing strip is provided between said cover and said chamber wall.

10. The apparatus according to claim 9, wherein the sealing strip has holes therein providing a passage between said cover and said chamber wall, each of said holes supporting one of said sealing elements.

11. The apparatus according to claim 10, wherein the sealing strip pinchingly holds said sealing elements in said holes.

12. The apparatus according to claim 10, wherein said sealing elements are secured in said holes by retaining pins supported on the sealing strip that extend through said sealing elements.

\* \* \* \* \*